United States Patent
Choi et al.

(10) Patent No.: US 11,145,535 B2
(45) Date of Patent: Oct. 12, 2021

(54) PLANARIZATION PROCESS, APPARATUS AND METHOD OF MANUFACTURING AN ARTICLE

(71) Applicant: CANON KABUSHIKI KAISHA, Tokyo (JP)

(72) Inventors: Byung-Jin Choi, Austin, TX (US); Seth J. Barnesberger, Austin, TX (US); Se-Hyuk Im, Austin, TX (US)

(73) Assignee: CANON KABUSHIKI KAISHA, Tokyo (JP)

(*) Notice: Subject to any disclaimer, the term of this patent is extended or adjusted under 35 U.S.C. 154(b) by 140 days.

(21) Appl. No.: 16/542,062

(22) Filed: Aug. 15, 2019

(65) Prior Publication Data
US 2021/0050245 A1 Feb. 18, 2021

(51) Int. Cl.
*H01L 21/687* (2006.01)
*H01L 21/3105* (2006.01)

(52) U.S. Cl.
CPC .. *H01L 21/68785* (2013.01); *H01L 21/31051* (2013.01); *H01L 21/687* (2013.01)

(58) Field of Classification Search
CPC ............. H01L 21/687; H01L 21/31051; H01L 21/68785
USPC .......................................... 438/758; 361/234
See application file for complete search history.

(56) References Cited

U.S. PATENT DOCUMENTS

| | | | |
|---|---|---|---|
| 5,563,683 A * | 10/1996 | Kamiya | G03F 7/707 355/53 |
| 5,923,408 A * | 7/1999 | Takabayashi | H01L 21/68742 355/53 |
| 6,464,790 B1 | 10/2002 | Sherstinsky | |
| 7,292,426 B2 * | 11/2007 | Ito | G03F 7/70708 361/234 |
| 7,790,231 B2 * | 9/2010 | McCutcheon | H01L 21/67092 427/355 |
| 8,741,199 B2 | 6/2014 | Lan | |
| 9,529,274 B2 | 12/2016 | Ganapathisubramanian et al. | |
| 9,865,494 B2 * | 1/2018 | Ichinose | G03F 7/20 |
| 10,310,390 B2 * | 6/2019 | Chen | G03F 1/42 |
| 2010/0059904 A1 * | 3/2010 | Kasumi | B29C 59/04 264/293 |
| 2015/0091230 A1 * | 4/2015 | GanapathiSubramanian | B25B 11/005 269/21 |
| 2017/0165898 A1 | 6/2017 | Johannes et al. | |

* cited by examiner

*Primary Examiner* — David Vu
*Assistant Examiner* — Brandon C Fox
(74) *Attorney, Agent, or Firm* — Canon U.S.A., Inc. IP Division

(57) ABSTRACT

A chuck is provided. The chuck comprises a plurality of lands protruding from a surface of the chuck, the lands defining a series of zones; and a trenched recessed from the surface of the chuck in at least one of the zones.

17 Claims, 10 Drawing Sheets

PLANARIZATION PROCESS, APPARATUS AND METHOD OF MANUFACTURING AN ARTICLE

BACKGROUND

Field of Art

The present disclosure relates to substrate processing, and more particularly, to the planarization of surfaces in semiconductor fabrication.

Description of the Related Art

Planarization techniques are useful in fabricating semiconductor devices. For example, the process for creating a semiconductor device includes repeatedly adding and removing material to and from a substrate. This process can produce a layered substrate with an irregular height variation (i.e., topography), and as more layers are added, the substrate height variation can increase. The height variation has a negative impact on the ability to add further layers to the layered substrate. Separately, semiconductor substrates (e.g., silicon wafers) themselves are not always perfectly flat and may include an initial surface height variation (i.e., topography). One method of addressing this issue is to planarize the substrate between layering steps. Various lithographic patterning methods benefit from patterning on a planar surface. In ArFi laser-based lithography, planarization improves depth of focus (DOF), critical dimension (CD), and critical dimension uniformity. In extreme ultraviolet lithography (EUV), planarization improves feature placement and DOF. In nanoimprint lithography (NIL) planarization improves feature filling and CD control after pattern transfer.

A planarization technique sometimes referred to as inkjet-based adaptive planarization (IAP) involves dispensing a variable drop pattern of polymerizable material between the substrate and a superstrate, where the drop pattern varies depending on the substrate topography. A superstrate is then brought into contact with the polymerizable material after which the material is polymerized on the substrate, and the superstrate removed. Improvements in planarization techniques, including IAP techniques, are desired for improving, e.g., whole wafer processing and semiconductor device fabrication.

SUMMARY

A chuck is provided. The chuck comprises at least a plurality of lands and at least one trench. The plurality of lands protrudes from a surface of the chuck and defines a series of zones. The trench is formed in at least one of the zones. The series of zones may include a peripheral zone immediately adjacent to an outermost land of the plurality of lands and a plurality of inner zones surrounded by the peripheral zone, and the trench is formed in at least one of the inner zones at an area distal to a center of the chuck. The peripheral zone may have a width smaller than a width of each of the inner ring zones. The trench may be formed in each of the inner zones with a width less than a half width of the inner zones.

The chuck may further comprise a trench formed in the peripheral zone at an area proximal to the center of the chuck. The series of zones may include a peripheral zone immediately adjacent to an outermost land of the plurality of lands and a plurality of inner zones surrounded by the peripheral zone, and the lands defining the series of inner zones are equally distant from each other. The series of zones may include a peripheral zone immediately adjacent to an outermost land of the plurality of lands and a plurality of inner zones surrounded by the peripheral zone, and the outermost land has a height less than a height of the lands defining the inner zones. The trench formed in the at least one zone may have a depth at least ten times larger than a height of each of the lands. The chuck may further comprise a fluid port in fluid communication with the trench. The series of zones may be arranged concentrically about a center zone of the chuck. The chuck may be configured to retain a substrate, a superstrate, or a wafer to the surface thereof. The substrate, superstrate, or wafer may be retained by the chuck by applying a negative pressure to a zone surrounded by the lands.

A method of using a chuck is also provided. The chuck has a series of zones defined by a plurality of lands protruding from a surface of the chuck and a trenched recessed from the surface of the chuck in at least one of the series of zones is provided. A superstrate is retained on the surface of the chuck. The superstrate is advanced to be in contact with a formable material dispensed the substrate. The formable material is cured with a curing source. After curing, the superstrate is separated from the cured formable material by the chuck.

The trench may be formed in each of the inner zone with a width less than a half width of each of the inner zone. The trench formed in the peripheral zone in an area is proximal to the center of the chuck. The method may further comprise forming the trench of each of the zones with a depth at least ten times larger than a height of each of the lands. A vacuum port is formed in fluid communication with each of the trenches. The series of zones is defined into a peripheral zone immediately adjacent to an outermost land of the plurality of lands and a plurality of inner zones surrounded by the peripheral zone. The lands define the series of inner zones are equally distant from each other.

The method may further comprise applying a formable material on the substrate retained by the chuck. Another chuck having a same structure of the chuck is used to retain a superstrate to advance the superstrate in contact with the formable material.

A method of manufacturing an article is provided. A formable material is dispensed on a substrate. A superstrate is retained with a superstrate chuck. The superstrate chuck is defined with a series of zones by a plurality of lands protruding from a surface of thereof, and a trench recessed from the surface of the superstrate chuck is formed in at least one of the series of zones. The superstrate is advanced to be in contact with a formable material dispensed on the substrate. The formable material is cured with a curing source. After curing, the superstrate is separated from the formable material by the chuck.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

Figure 1:
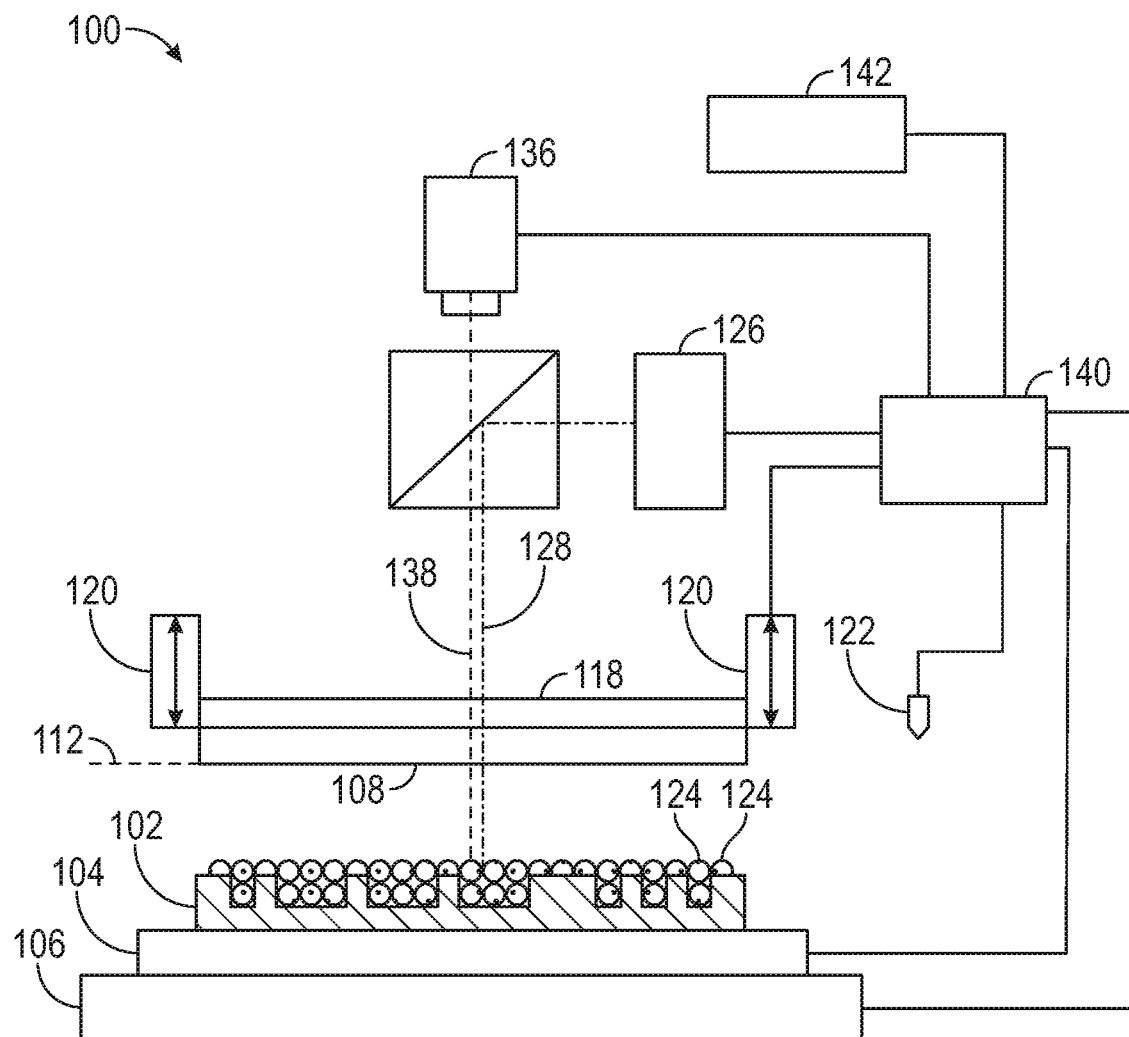
FIG. 1 is a diagram illustrating a planarization system.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Planarization System

FIG. 1 illustrates a system for planarization. The planarization system 100 is used to planarize a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x-, y-, z-, θ-, ψ, and φ-axes. The substrate positioning stage 106, the substrate 102, and the substrate chuck 104 may also be positioned on a base (not shown). The substrate positioning stage may be a part of a positioning system.

Spaced apart from the substrate 102 is a superstrate 108 having a working surface 112 facing substrate 102. Superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate is readily transparent to UV light. Surface 112 is generally of the same areal size or slightly smaller as the surface of the substrate 108.

Superstrate 108 may be coupled to or retained by a superstrate chuck 118. The superstrate chuck 118 may be, but is not limited to, vacuum chuck, pin-type chuck, groove-type chuck, electrostatic chuck, electromagnetic chuck, and/or other similar chuck types. The superstrate chuck 118 may be configured to apply stress, pressure, and/or strain to superstrate 108 that varies across the superstrate 108. In an embodiment the superstrate chuck is likewise readily transparent to UV light. The superstrate chuck 118 may include a system such as a zone based vacuum chuck, an actuator array, a pressure bladder, etc., which can apply a pressure differential to a back surface of the superstrate 108 to cause the template to bend and deform. In one embodiment, the superstrate chuck 118 includes a zone based vacuum chuck which can apply a pressure differential to a back surface of the superstrate, causing the superstrate to bend and deform as further detailed herein.

The superstrate chuck 118 may be coupled to a planarization head 120 which is a part of the positioning system. The planarization head 120 may be movably coupled to a bridge. The planarization head 120 may include one or more actuators such as voice coil motors, piezoelectric motors, linear motor, nut and screw motor, etc., which are configured to move the superstrate chuck 118 relative to the substrate 102 in at least the z-axis direction, and potentially other directions (e.g. x-, y-, θ-, ψ-, and φ-axis).

The planarization system 100 may further comprise a fluid dispenser 122. The fluid dispenser 122 may also be movably coupled to the bridge. In an embodiment, the fluid dispenser 122 and the planarization head 120 share one or more of all positioning components. In an alternative embodiment, the fluid dispenser 122 and the planarization head move independently from each other. The fluid dispenser 122 may be used to deposit droplets of liquid formable material 124 (e.g., a photocurable polymerizable material) onto the substrate 102 with the volume of deposited material varying over the area of the substrate 102 based on at least in part upon its topography profile. Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The planarization system 100 may further comprise a curing system that includes a radiation source 126 that directs actinic energy, for example, UV radiation, along an exposure path 128. The planarization head 120 and the substrate positioning state 106 may be configured to position the superstrate 108 and the substrate 102 in superimposition with the exposure path 128. The radiation source 126 sends the actinic energy along the exposure path 128 after the superstrate 108 has contacted the formable material 128. FIG. 1 illustrates the exposure path 128 when the superstrate 108 is not in contact with the formable material 124. This is done for illustrative purposes so that the relative position of the individual components can be easily identified. An individual skilled in the art would understand that exposure path 128 would not substantially change when the superstrate 108 is brought into contact with the formable material 124.

The planarization system 100 may further comprise a camera 136 positioned to view the spread of formable material 124 as the superstrate 108 contacts the formable material 124 during the planarization process. FIG. 1 illustrates an optical axis 138 of the field camera's imaging field. As illustrated in FIG. 1, the planarization system 100 may include one or more optical components (dichroic mirrors, beam combiners, prisms, lenses, mirrors, etc.) which combine the actinic radiation with light to be detected by the camera 136. The camera 136 may include one or more of a CCD, a sensor array, a line camera, and a photodetector which are configured to gather light at a wavelength that shows a contrast between regions underneath the superstrate 108 and in contact with the formable material 124 and regions underneath the superstrate 108 but not in contact with the formable material 124. The camera 136 may be configured to provide images of the spread of formable material 124 underneath the superstrate 108, and/or the separation of the superstrate 108 from cured formable material 124. The camera 136 may also be configured to measure interference fringes, which change as the formable material 124 spreads between the gap between the surface 112 and the substrate surface.

The planarization system 100 may be regulated, controlled, and/or directed by one or more processors 140 (controller) in communication with one or more components and/or subsystems such as the substrate chuck 104, the substrate positioning stage 106, the superstrate chuck 118, the planarization head 120, the fluid dispenser 122, the radiation source 126, and/or the camera 136. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

In operation, either the planarization head 120, the substrate position stage 106, or both vary a distance between the superstrate 118 and the substrate 102 to define a desired space (a bounded physical extent in three dimensions) that is filled with the formable material 124. For example, the planarization head 120 may be moved toward the substrate and apply a force to the superstrate 108 such that the superstrate contacts and spreads droplets of the formable material 124 as further detailed herein.

Planarization Process

Figure 2A:
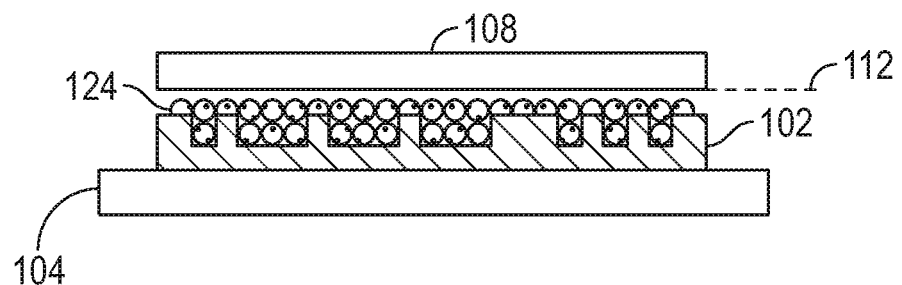
FIGS. 2a to 2c illustrate a planarization process.
Figure 2B:
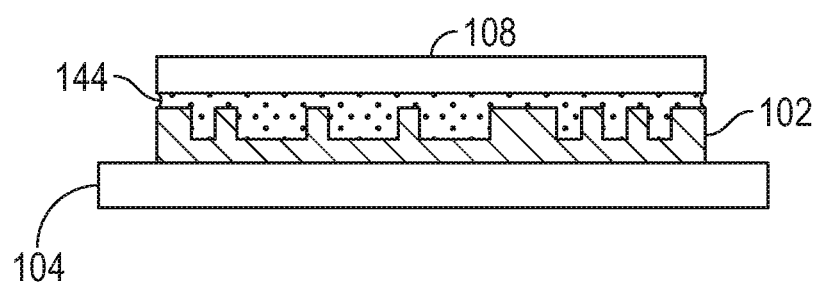
Figure 2C:
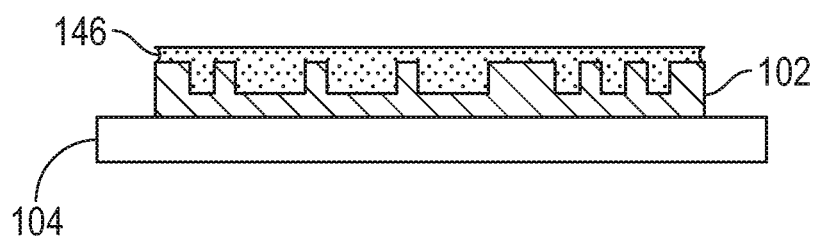

The planarization process includes steps which are shown schematically in FIGS. 2a-2c. As illustrated in FIG. 2a, the formable material 124 is dispensed in the form of droplets onto the substrate 102. As discussed previously, the substrate surface has some topography which may be known based on previous processing operations or may be measured using a profilometer, AFM, SEM, or an optical surface profiler based on optical interference effect like Zygo NewView 8200. The local volume density of the deposited formable material 124 is varied depending on the substrate topography. The superstrate 108 is then positioned in contact with the formable material 124.

FIG. 2b illustrates a post-contact step after the superstrate 108 has been brought into full contact with the formable material 124 but before a polymerization process starts. As the superstrate 108 contacts the formable material 124, the droplets merge to form a formable material film 144 that fills the space between the superstrate 108 and the substrate 102. Preferably, the filling process happens in a uniform manner without any air or gas bubbles being trapped between the superstrate 108 and the substrate 102 in order to minimize non-fill defects. The polymerization process or curing of the formable material 124 may be initiated with actinic radiation (e.g., UV radiation). For example, radiation source 126 of FIG. 1 can provide the actinic radiation causing formable material film 144 to cure, solidify, and/or cross-link, defining a cured planarized layer 146 on the substrate 102. Alternatively, curing of the formable material film 144 can also be initiated by using heat, pressure, chemical reaction, other types of radiation, or any combination of these. Once cured, planarized layer 146 is formed, the superstrate 108 can be separated therefrom. FIG. 2c illustrates the cured planarized layer 146 on the substrate 102 after separation of the superstrate 108. The substrate and the cured layer may then be subjected to additional known steps and processes for device (article) fabrication, including, for example, patterning, curing, oxidation, layer formation, deposition, doping, planarization, etching, formable material removal, dicing, bonding, and packaging, and the like. The substrate may be processed to produce a plurality of articles (devices).

Spreading, Filling, and Curing Planarization Material Between Superstrate and Substrate One scheme for minimizing entrapment of air or gas bubbles between the superstrate 108 and the substrate as the formable material droplets spread, merge and fill the gap between the superstrate and the substrate is to position the superstrate such that it makes initial contact with the formable material in the center of the substrate with further contact then proceeding radially in a center to perimeter fashion. This requires a deflection or bowing of the superstrate or substrate or both to create a curvature profile in the superstrate. However, given that the superstrate 108 is typically of the same or similar areal dimension as the substrate 102, a useful whole superstrate bowing curvature profile requires both a significant vertical deflection of the superstrate, and a concomitant vertical motion by the superstrate chuck and planarization assembly. Such a significant vertical deflection and motion may be undesirable for control, accuracy, and system design considerations. Such a superstrate profile can be obtained by, for example, applying a back pressure to the interior region of the superstrate. However, in doing so, a perimeter holding region is still required to keep the superstrate retained on the superstrate chuck. If both the perimeter edges of the superstrate and the substrate are chucked flat during formable material droplet spreading and merging, there will be no available superstrate curvature profile in this flat chucked area. This may compromise the droplet spreading and merging, which may also lead to non-fill defects in the region. In addition, once spreading and filling of the formable material is complete, the resultant stack of a superstrate chuck, a chucked superstrate, the formable material, substrate, and a substrate chuck can be an over-constrained system. This may cause a non-uniform planarization profile of the resultant planarized film layer. That is, in such an over-constrained system, all flatness errors or variations from the superstrate chuck, including front-back surface flatness, can be transmitted to the superstrate and impact the uniformity of the planarized film layer.

Figure 3A:
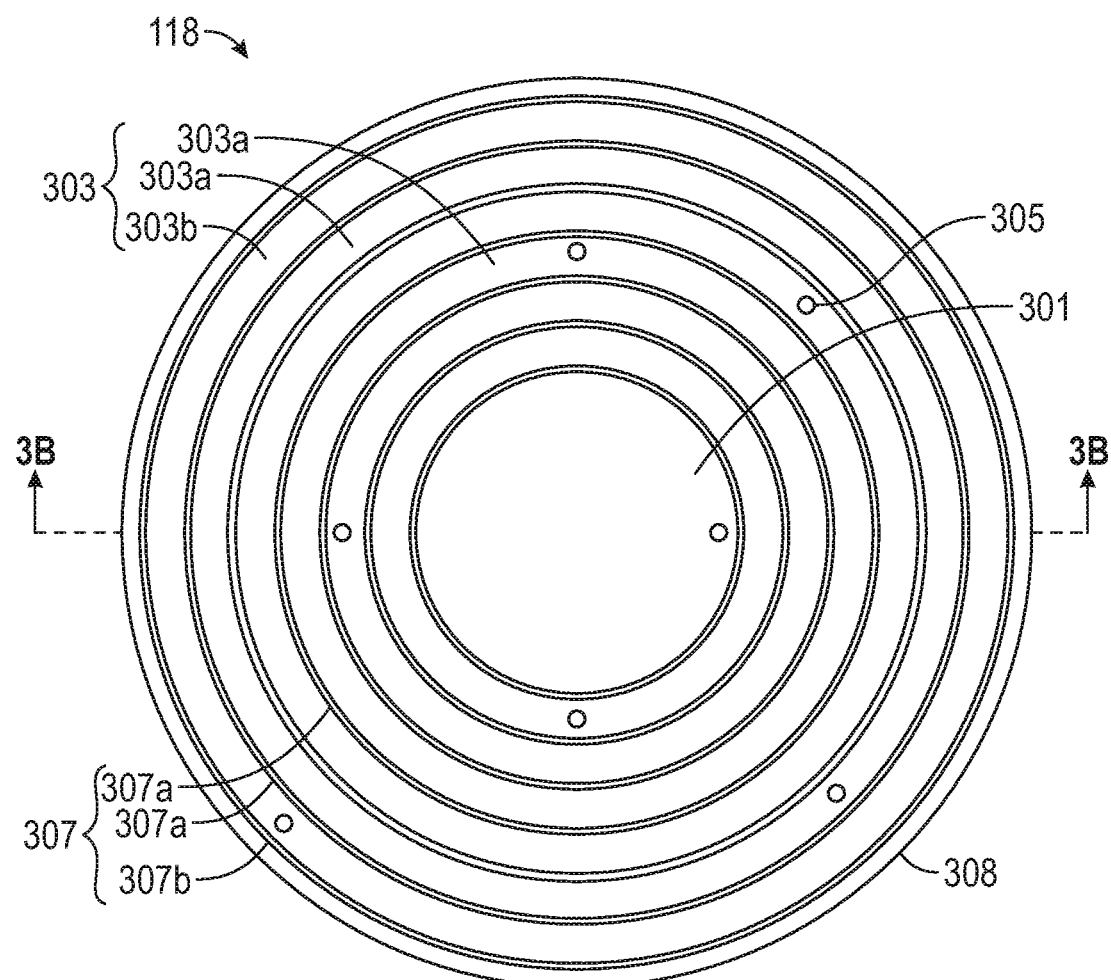
FIGS. 3a to 3b illustrate a multi-zone superstrate chuck in one embodiment.
Figure 3B:
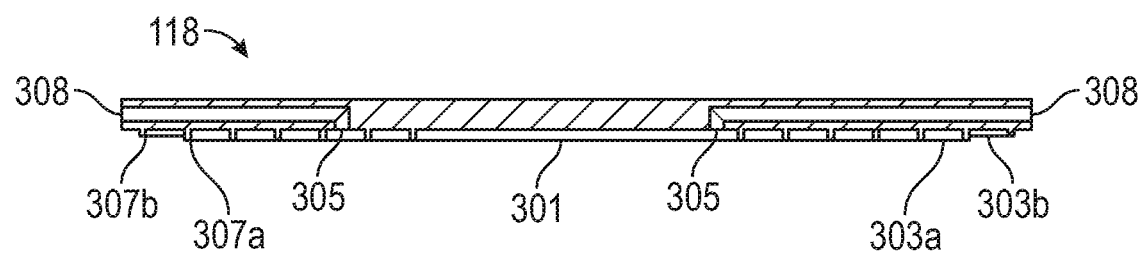

To resolve the above issues, in one embodiment, a multi-zone superstrate chuck 118 is provided as shown in FIGS. 3a and 3b. The superstrate chuck 118 includes a center zone 301 and a series of ring zones 303 about the center zone 301. The ring zones 303 may be defined into a peripheral ring zone 303b around an edge, a perimeter, or a periphery of the superstrate chuck 118 and a plurality of inner ring zones 303a located between the center zone 301 and the peripheral ring zone 303b. The multiple ring zones 303 may be defined by a series of lands 307 protruding from a surface of the superstrate chuck 118. As shown in FIGS. 3a and 3b, the lands 307 may be formed about the center zone 301. In each of the ring zones 303, at least one port 305 is formed to connect through the superstrate chuck 118, to allow a pressure source to apply positive pressure or negative pressure, for example, vacuum, to a superstrate retained thereby.

FIG. 3b shows a side cross-sectional view of the superstrate chuck 118. Each of the lands 307 protrudes from a surface of the superstrate chuck 118 with a height. The lands 307 include a peripheral land 307b surrounding the peripheral ring zone 303b and a series of inner lands 307a between the center zone 301 and the peripheral ring zone 303b. As shown in FIG. 3b, the inner lands 307a have substantially the same height, while the height of the peripheral land 307b is less than those of the inner lands 307a. The center zone 301 of the superstrate chuck 118 may be in the form of a circular cavity, such that the pressure source (not shown) may apply air or gas pressure through the associated channel 308 and port 305 to deflect a center portion of a retained superstrate. Vacuum pressure may likewise be applied to center zone 301 through the same channel and port. The center zone 301 of the superstrate chuck 118 may be aligned with a center portion of the retained superstrate. Similarly, the peripheral ring zone 303a may be aligned with a perimeter or a periphery of the retained superstrate. Surrounding ring zones 303 are likewise provided with respective channels 308 and ports 305 for application of pressure or vacuum.

Figure 4A:
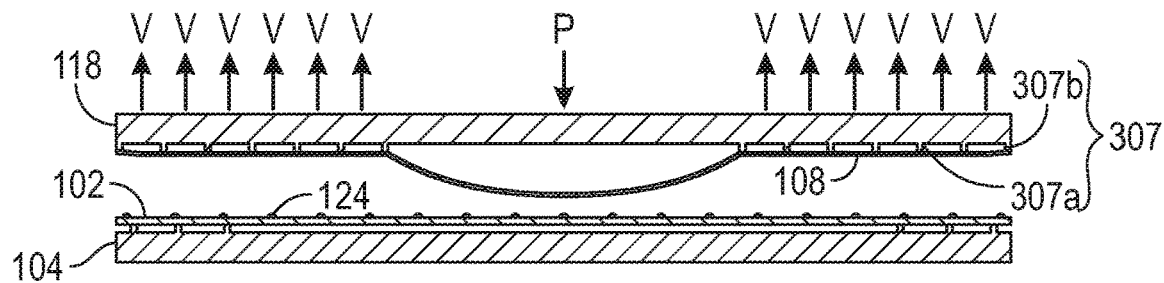
FIGS. 4a to 4e show the operation of the superstrate chuck for forming a layer on a substrate.
Figure 4B:
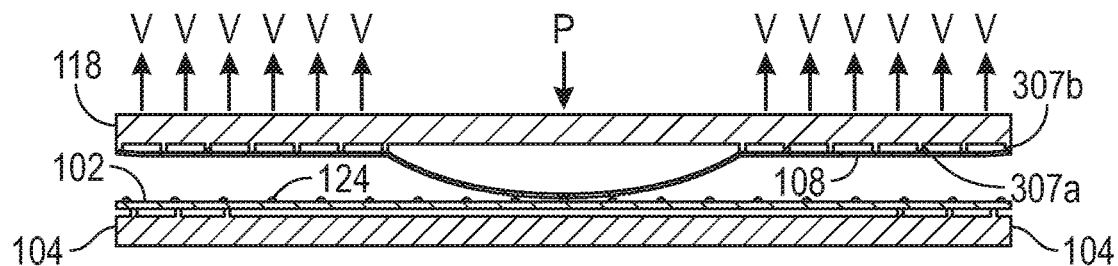

Turning to FIGS. 4a-4e, a process for contacting, spreading and merging droplets of deposited formable material 124 is depicted. As shown in FIG. 4a, before the superstrate 108 is brought in contact with the formable material 124, a positive pressure (indicated by arrow P) is applied through ports 305 to the center zone 301 of the superstrate chuck 118 to the retained superstrate 108 to deflect the center portion of the superstrate 108 towards the formable material 124. The pressure P is applied to the center zone 301 to control an initial deflection at a predetermined range and to maintain a predetermined curvature of the superstrate 108 as shown in FIG. 4a. In the meantime, a negative pressure, preferably, a vacuum (indicated by arrows V), is applied to the superstrate 108 through the ports 305 in the ring zones 303 to retain the superstrate 108 with the superstrate chuck 118. The superstrate 108 is then brought into initial contact with the droplets of formable material 124 as show in FIG. 4b.

Figure 4C:
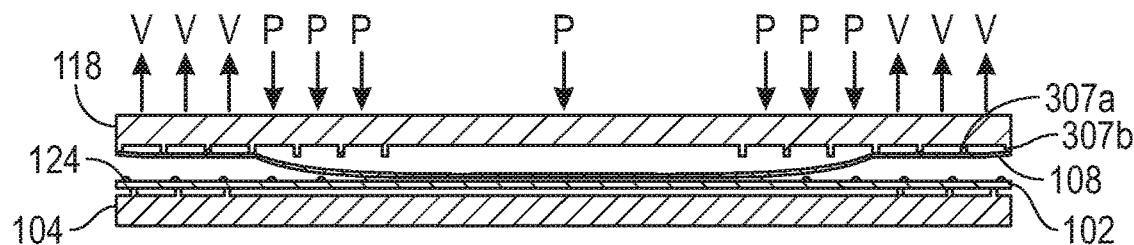

The deflection of the superstrate 108 is then extended from the center portion in a radially outward direction by sequentially releasing the vacuum (V) from the inner ring zones 303a proximal to the center zone 301. In this fashion, the droplets of formable material are contacted, spread and merged to form a film layer with a fluid front that progresses radially outward as the superstrate contacts and conforms to the substrate. When the vacuum is sequentially released from the inner ring zones 303a, the pressure P applied through the center zone 301 is maintained at a desired value. Pressure P may also be applied to the superstrate 108 through the channels 308 and ports 305 in the inner ring zones 303a from which the vacuum has been released. In the embodiment as shown in FIG. 4c, vacuum has been sequentially released from three inner rings 303a closest to the inner zone 301, with pressure P sequentially applied as the vacuum has been sequentially released. Planarization head may also be moved downward during this sequential vacuum release and pressurization.

Figure 4D:
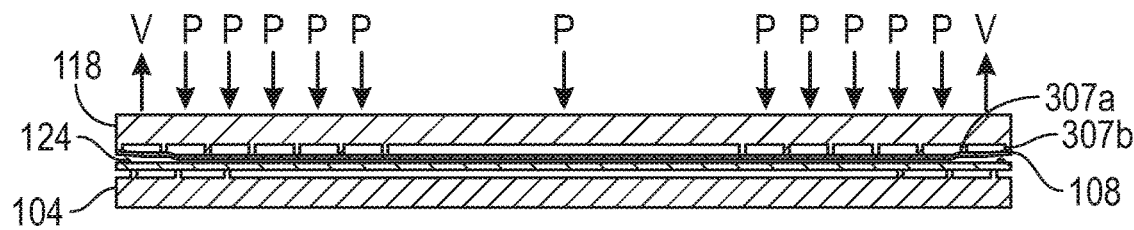

The deflection of the superstrate 108 is then further extended in a radial direction sequentially until the vacuum is released from all the inner ring zones 303a, while the vacuum V applied via the peripheral ring zone 303b is maintained. For each of the inner ring zones 303a, pressure P is also applied once the vacuum has been released. As shown in FIG. 4d, when the vacuum has been released from all inner ring zones 303a, the superstrate 108 is deflected to conform to the substrate 102 except for the periphery of substrate 108 which remains retained by the superstrate chuck 118 via the vacuum V applied through the peripheral zone 303b. As such, the edge of superstrate 108 remains in a deflected, curved condition for the final spreading and merging of formable material droplets dispensed on the periphery of the substrate 102. In addition, the peripheral land 307b, which is lower relative to the inner lands 307a, facilitates the maintenance of such curvature.

Figure 4E:
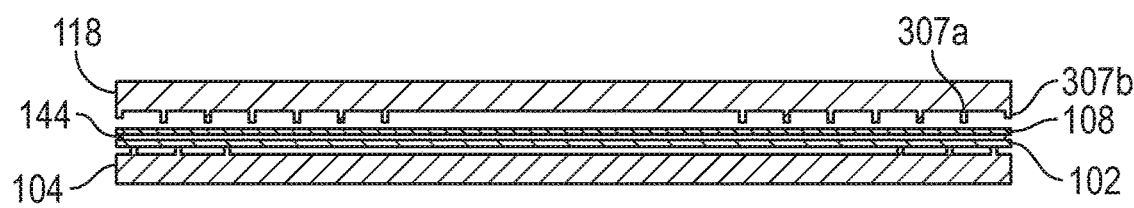

In FIG. 4e, the vacuum V applied through the peripheral ring zone 303b is then released to in order to release the superstrate 108 entirely from the superstrate chuck 118. This provides multiple advantages. First, by releasing the periphery of superstrate 108 from the peripheral ring zone 303b which had been retained in a curved condition, the spreading and merging of the remaining formable material droplets can be completed in the same center-to-perimeter radial fashion, thus continuing to minimize air or gas trapping and resultant non-fill defects. Specifically, the peripheral land 307b which is recessed relative to the inner lands 307a allows the superstrate 108 to maintain the desired curvature prior to release. Secondly, by completely releasing the superstrate 108 from the superstrate chuck 118, any over-constraint of the superstrate 108 due to the chucking condition is removed, thereby reducing local non-uniform planarization that might otherwise occur due to such constrained conditions. Thirdly, the release of the superstrate 108 from the superstrate chuck 118 eliminates the transfer of any chuck non-flatness error or variation to the superstrate 108, which also reduces localized non-uniform planarization variations.

Once the superstrate 108 is released, curing energy may be applied to cure the formable material to form the planarized layer. As previously mentioned, the curing source may a light beam for curing the formable material 124. In one embodiment, the size of the light beam may be adjusted or controlled with reference to a diameter of the superstrate. The light beam can also be controlled to be incident on the substrate with a predetermined angle. During curing, a lateral position (i.e., in X-Y plane) of the substrate 102 relative to a curing source may be adjusted. After the curing process, the superstrate 108 is re-retained by the superstrate chuck 118 and superstrate 108 is then separated from the substrate as further described herein.

Figure 5:
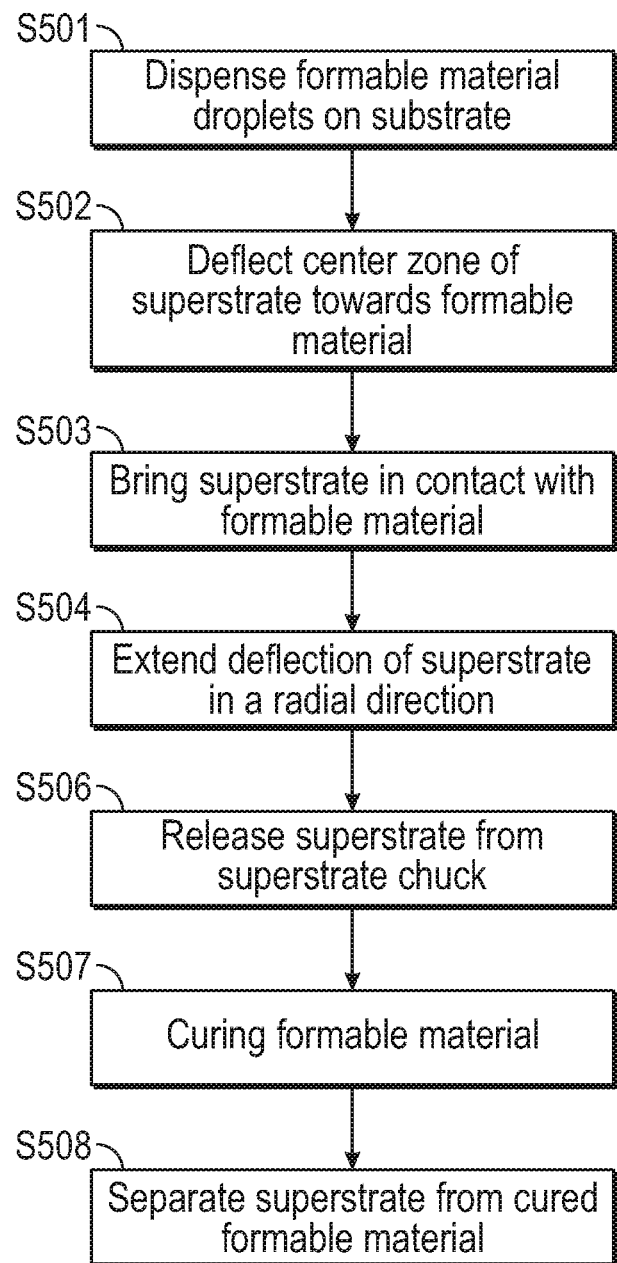
FIG. 5 is a flow chart of the planarization process as illustrated in FIGS. 4a to 4e.

FIG. 5 illustrates a flow chart of the planarization process described as shown in FIGS. 3 and 4. In Step 501, formable material droplets 124 are dispensed on the substrate 102. The center zone of the superstrate 108 is deflected towards the formable material droplets 124 in step S502. The deflected superstrate 108 is then advanced by the superstrate chuck 118 to be in contact with the formable material 124 in step S503. The deflection of the superstrate 108 is extended from the center zone towards the perimeter of the superstrate 108 in step S504. Application of force to hold the superstrate 108 by the superstrate chuck 118, for example, by vacuum applied to the perimeter of the superstrate 108 is then stopped, such that the superstrate 108 is released (i.e., de-chucked) from the superstrate chuck 118 in step S506. The formable material 124 is cured in step S507. After curing, the superstrate 108 is re-retained by the superstrate chuck 118 to separate the superstrate 108 from the cured formable material 146.

When using, for example, a UV photocurable material as the formable material 124, it is desirable that the superstrate chuck 118 is transparent with high UV light transmissivity UV curing (as well as high light transmissivity for imaging, for example, by the camera 136 as shown in FIG. 1). As discussed above, pneumatic supply channels 308 and ports 305, zones 303, and lands 307 are integrated into the superstrate as shown in FIGS. 3 and 4. These structures may create a problem for UV curing. Particularly, the UV transmissivity in areas below the channels 308, and lands 307 can be significantly reduced compared to areas with no such features, leading to an under-curing or non-uniform curing of the formable material. This phenomenon is sometimes referred to as a "shadowing effect". Shadowing effects may be particularly significant at edges of the lands 307. Additionally, when the superstrate 100 is chucked to the lands 307, there will be thin air gaps as two surfaces do not optically touch each other. This type of thin gap can sometimes block UV completely. This phenomenon is known as the "thin film effect" between the land and the superstrate.

One solution to the above "shadow effect" includes movement of the stack of superstrate and substrate on a wafer stage in x, y and/or θ coordinates after de-chucking (i.e., releasing) the superstrate from the superstrate chuck. By moving the wafer stage in this fashion during UV exposure, regions of the superstrate and substrate that would have remained under the channels, ports, and lands can be periodically moved to regions below the superstrate chuck where no chuck features are present. The relative motion required can be estimated from the following equation (1):

$$I_m = \frac{I_h(w_h - w_l) + I_l w_l}{w_h}, \quad (1)$$

where $I_m$ is the desired average intensity across range of motion, $I_h$ is the high intensity across no feature area of the chuck (i.e., the maximum or "max" intensity), $I_l$ is the intensity at the subject feature (i.e., the lowest or "low" intensity), $w_h$ is the estimated motion range to achieve $I_m$, $w_l$ is the subject feature width (e.g., width of the land, port, or channel). For example, assuming 100% UV transmission in the featureless areas, and assuming the desired $I_m$ is 90% of that value, and further assuming $w_l=1$ mm, from Equation (1), the desired range of relative motion $w_h=8.0$ mm. Alternatively, the UV source can be moved by tipping or tilting the source relative to the superstrate chuck to change the angle of the UV light incident on the superstrate chuck, which can also reduce the shadowing effect near the subject features. The "thin film effect" can be avoided by relative movement in the z-axis direction to create a sufficient gap between the superstrate and superstrate chuck, for example, by de-chucking the superstrate and moving the wafer stage in the z-direction away from the superstrate chuck or. The various solutions described above can be applied individually or in combination to improve the total UV dosage uniformity in certain regions and minimize shadowing and thin film effects. In various embodiments, the applied UV light beam can be smaller, same size, or larger than the substrate or superstrate. In one embodiment, the applied UV light beam can be larger than the substrate by a dimension that accommodates the above relative motion $w_h$ while continuing to expose the entirety of the substrate to the UV light.

Separating Superstrate from Cured Planarized Film Layer

Figure 6A:
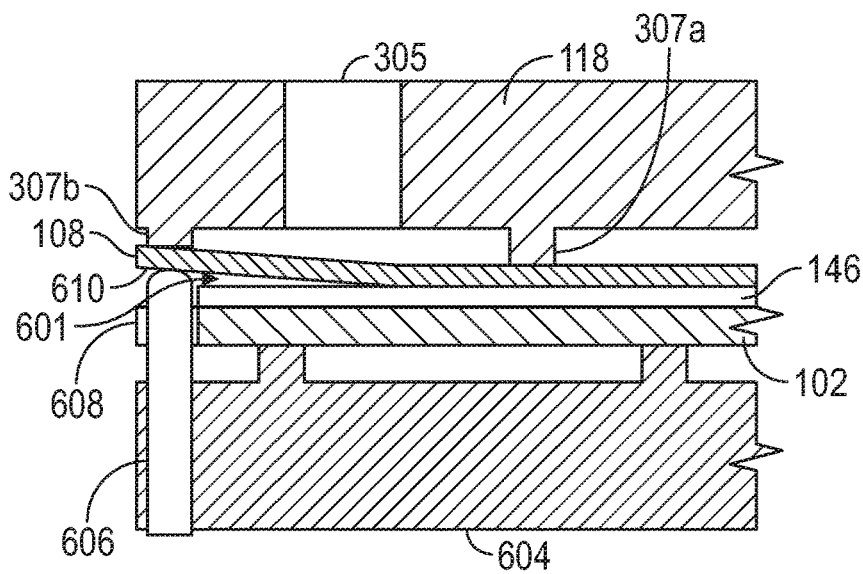
FIG. 6a shows a separation crack initiated at an edge of a stack of the substrate and the superstrate in one embodiment and FIG. 6b shows the alignment of a retractable pin with a substrate notch for initiation such separation crack.
Figure 6B:
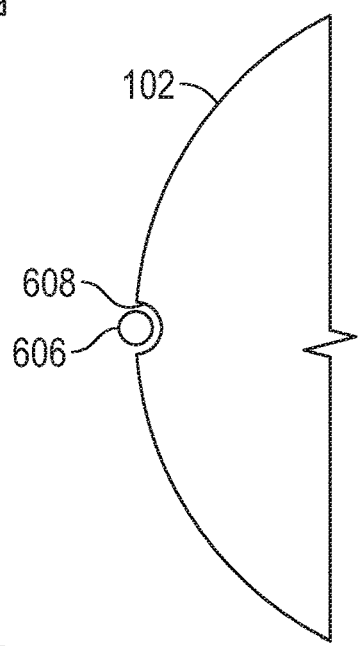
Figure 6C:
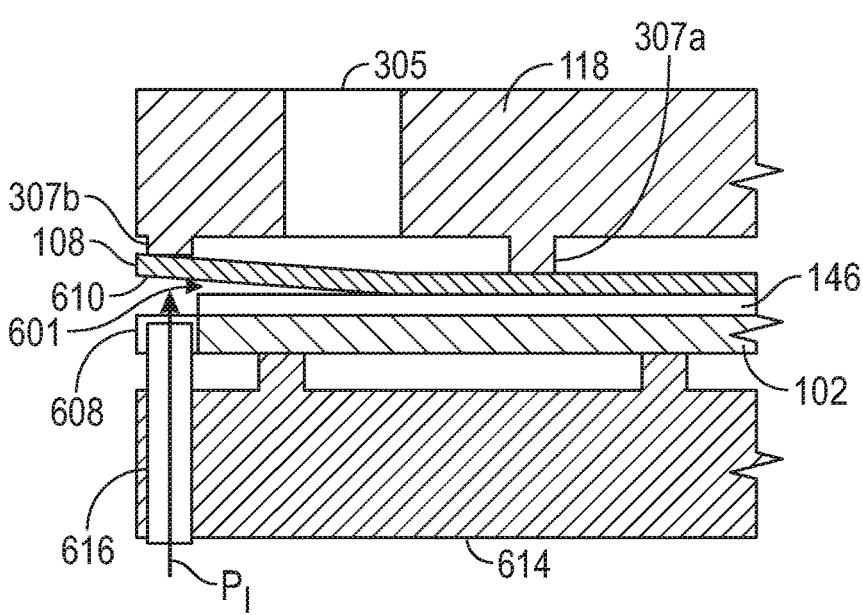
FIG. 6c shows a separation crack initiated at an edge of a stack of the substrate and the superstrate in another embodiment.

Once the formable material is cured and the planarized film layer is formed, it is necessary to remove or release the superstrate from the formed layer. However, when the superstrate and substrate have the same or similar areal dimensions, it is difficult to initiate and propagate a separation crack between the superstrate and formed layer as is necessary in order to fully separate the superstrate from the formed layer. This problem can be resolved by the structure and methods shown in FIGS. 6-8. As shown in FIGS. 6a and 6b, substrate chuck 604 includes retractable pin 606 located at the periphery of the chuck that can be aligned with notch 608 on substrate 102. Such a notch (e.g. wafer notch) is common to semiconductor wafers for purposes of orienting the wafer during processing and handling. In operation, retractable pin 606 is positioned in alignment with notch 608 located on substrate 102. To initiate separation, pin 606 moves upwardly through notch 608 and into contact with a point 610 at the edge of superstrate 108, as shown in FIG. 6a. The force applied by pin 606 is sufficient to initiate separation crack 601 between superstrate 108 and cured layer 146 on substrate 102. Once the crack 601 is created, the edge of superstrate 108 is deflected towards the superstrate chuck 118 by application of vacuum pressure through port 305 of superstrate chuck 118. This is facilitated by land 307b of the superstrate chuck 118 being shorter than the adjacent land 307a, which provides a space for the edge of superstrate 108 to be deflected away from the substrate 102 and towards the superstrate chuck 118. The force applied to create the crack 601 can depend upon the geometric and physical conditions of the superstrate, planarized film layer, and substrate. Alternatively, the crack 601 may be created by introducing a positive pressure between the substrate 102 and the superstrate 108, as shown in FIG. 6c. Here substrate chuck 614 includes nozzle 616 connected to a positive fluid pressure source (not shown). Upon activation of nozzle 616, positive fluid pressure $P_f$ is delivered through nozzle 616 to point 610 at the edge of superstrate 118 with sufficient force to initiate separation crack 601. The positive fluid pressure may include a flow of clean dry air, helium, or nitrogen. While creating the crack 601, the superstrate 102 is retained in the superstrate chuck 118, and the substrate 102 is retained by the substrate chuck 104.

Figure 7A:
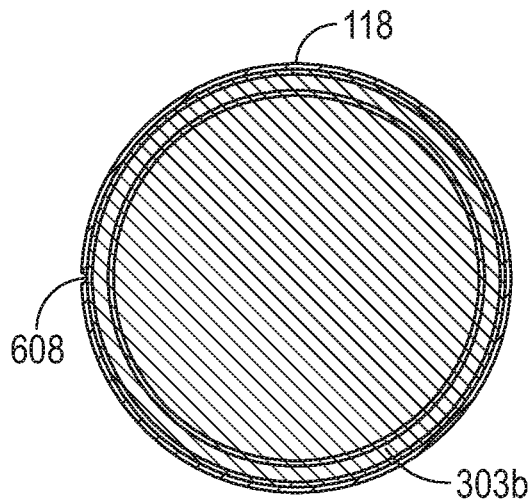
FIGS. 7a to 7c show the top view of the stack of the substrate and superstrate as a separation crack is initiated and propagated about a periphery of the stack.
Figure 7B:
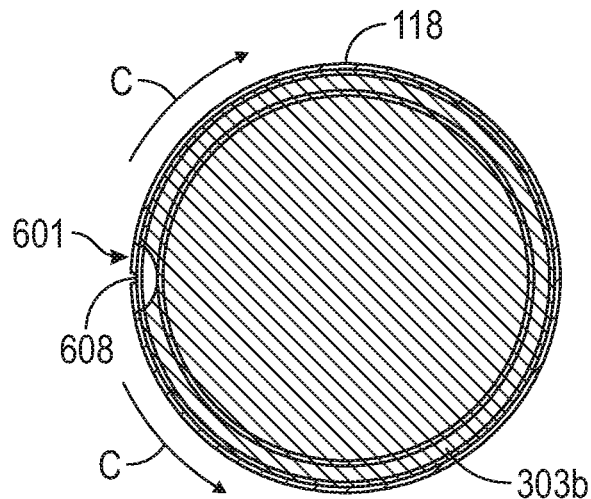
Figure 7C:
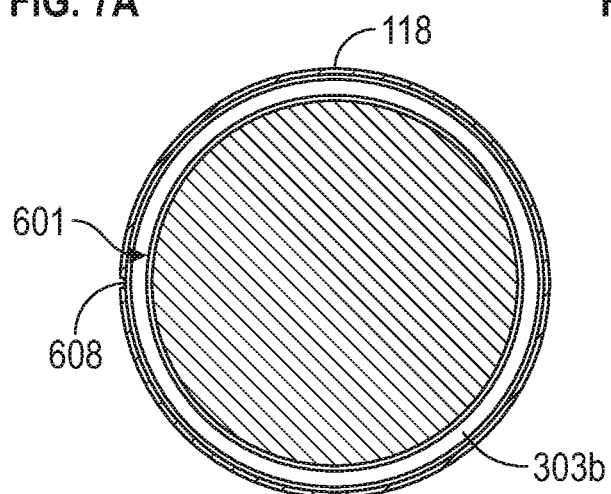
Figure 8:
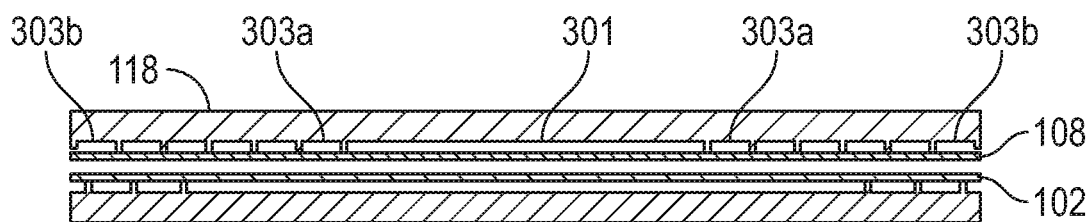
FIG. 8 shows the separated substrate and superstrate.

FIGS. 7-8 illustrate the progression of separation. FIG. 7a shows a top down view of the superstrate 118 in full contact (as indicated by the shaded region) with the formed layer on substrate. In FIG. 7b, separation crack 601 has been initiated as described above. Once the crack 601 is initiated, a high flow of negative pressure or vacuum is applied to outer ring zone 303b of superstrate chuck 118 so as to engage the edge of the superstrate 108 and propagate the separation crack 601 about the outer zone ring 303b. This propagation proceeds circumferentially in both directions from notch 608, as indicated by arrows C. To assist the propagation of crack 601 about the outer ring zone 303b, additional lateral air flow (not shown) can be supplied between the substrate 102 and the superstrate 108 as the crack propagation progresses. FIG. 7c shows the crack 601 fully propagated about outer ring zone 303b.

Once the separation crack has fully propagated around the outer ring zone, an upward motion may be applied along the Z-axis direction of the superstrate 108 to complete separation of the superstrate 108 from the cured layer on the substrate. FIG. 8 shows superstrate 108 fully separated from substrate 102. In completing separation, a significant upward motion of the superstrate 108 relative to the substrate 102 may induce a shearing stress at the remaining in-contact area between the superstrate 108 and the substrate 102. Alternatively, Z-direction motion can be stopped at an earlier desired position and separation can be advanced and concluded through continued vacuum pressure application to the inner and/or center ring zones. Such shear stress can be minimized by applying vacuum to one or more of the inner ring zones 303a and/or the center zone 301 during the continued separation.

Figure 9:
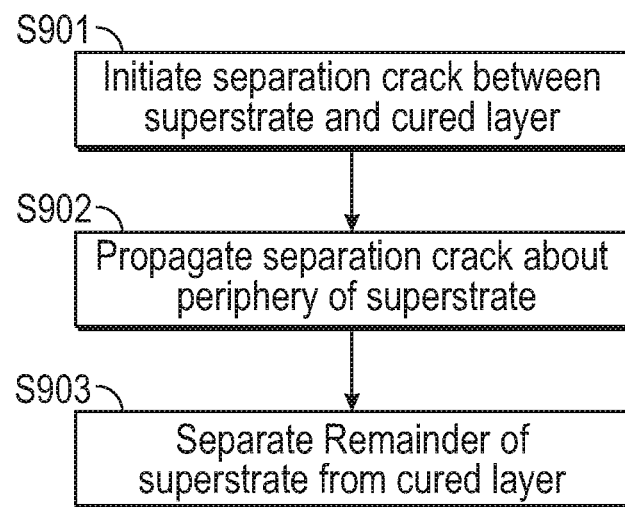
FIG. 9 is a flow chart of the separation process as illustrated in FIGS. 7 and 8.

FIG. 9 illustrates a flow chart of the separation process as described and shown in FIGS. 7 and 8. In Step S901, a separation crack initiated between the superstrate 108 and the cured layer. The separation crack is then propagated about a periphery of superstrate 108 in step S902. In step S903, the remainder of the superstrate is separated from the cured layer. In the embodiments discussed above, the separation of the superstrate 108 and the substrate 102 includes a step of creating a crack by a mechanical force such as pushing pin or air pressure, a step of applying vacuum pressure to the outer zone to propagate the crack, securely holding the superstrate 108, moving the superstrate 108 upwardly in Z-direction and away from the substrate 102 with a force safe enough to avoid de-chucking the superstrate upwardly, and a step of applying vacuum to the center of the superstrate 108 during the upward Z-direction movement to complete the separation. Alternatively or in combination with the above Z-direction motion schemes, the propagation of the separation can also be affected by continuously applying in-plane (or lateral) directional flow with high pressure from one or more sides of the substrate (not shown).

Figure 10:
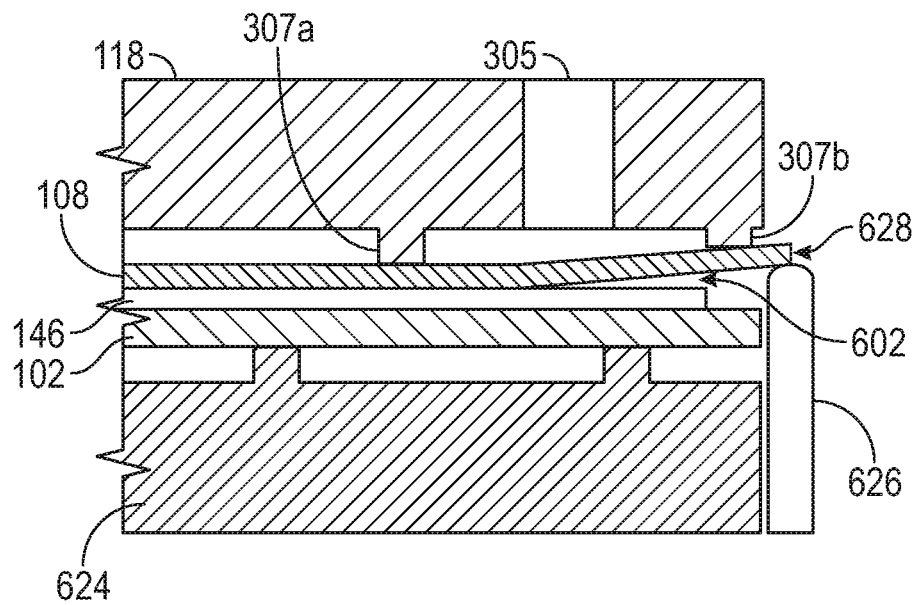
FIG. 10 shows a separation crack initiated at an edge of a stack of the substrate and the superstrate in a further embodiment.

In the FIG. 6 embodiments, crack initiation is initiated by an upward force applied through wafer notch 608 by either a mechanical pin 606 (FIG. 6a) or fluid nozzle 616 (FIG. 6b). FIG. 10 shows a further embodiment of a substrate chuck configured to initiate a separation crack. Here, substrate chuck 624 includes a separate retractable pin 626 that can initiate a separation crack when the superstrate 108 and substrate are arranged non-concentrically. This non-concentric arrangement results in a portion 628 of the superstrate 108 that overhangs the substrate 102. The crack 602 can be created by applying the force to the overhanging portion 110 via movement of pin 626. Alternatively, the overhanging portion 608 may also be obtained by using a superstrate slightly bigger than the substrate. In this way, the superstrate 108 can still be arranged concentric with the substrate 102. In either case, substrate chuck 624 can further include mechanical pins or nozzles, such as in the embodiments of FIG. 6a or 6b or otherwise, that are spaced apart from pin 626 to create multiple points about the superstrate periphery for initiating the separation crack.

Superstrate Chuck

As discussed above, the superstrate 108 is preferably retained or supported by the superstrate chuck 118 that applies pressure or vacuum (negative pressure) to a volume between the superstrate and the chucking surface within ring zones 303 that are defined by lands 307 extending from the chucking surface. Apart from the outermost land 307a, the inner lands 307b preferably have the same height such that the depths of the gaps between the adjacent inner lands 307b remains constant. The land heights (i.e., depth of the gaps) is usually kept very small, for example, in the order of about tens to thousands of microns, for reasons such as minimizing gas filling or evacuation response time, land stiffness characteristics, limiting thermal effects, such as expansion or contraction, etc. In operation, when vacuum is applied to a ring zone to retain the superstrate against the lands of the zone, a vacuum seal is created at the superstrate-land interface. However, when a sufficient force or a pressure is applied to the superstrate in the opposition direction of the chucking vacuum, the substrate may be lifted off the land of the chuck. At a certain gap between the superstrate and land, the vacuum seal fails or otherwise leaks resulting in a reduced or even zero vacuum pressure within the zone. The superstrate may then become unintentionally de-chucked from the chuck. Further, even if superstrate is does not become de-chucked, vacuum leakage can disrupt the level of control required, for example, when sequentially releasing vacuum pressure in adjacent ring zones in the FIGS. 4 and 5 process. Such leakage at the outer land can also negatively impact the controlled retention of the desired outer edge curvature of the superstrate in the process of FIGS. 4 to 5. Similarly, outer land leakage can disrupt the separation crack initiation and propagation in the process of FIGS. 7 to 9.

Figure 11A:
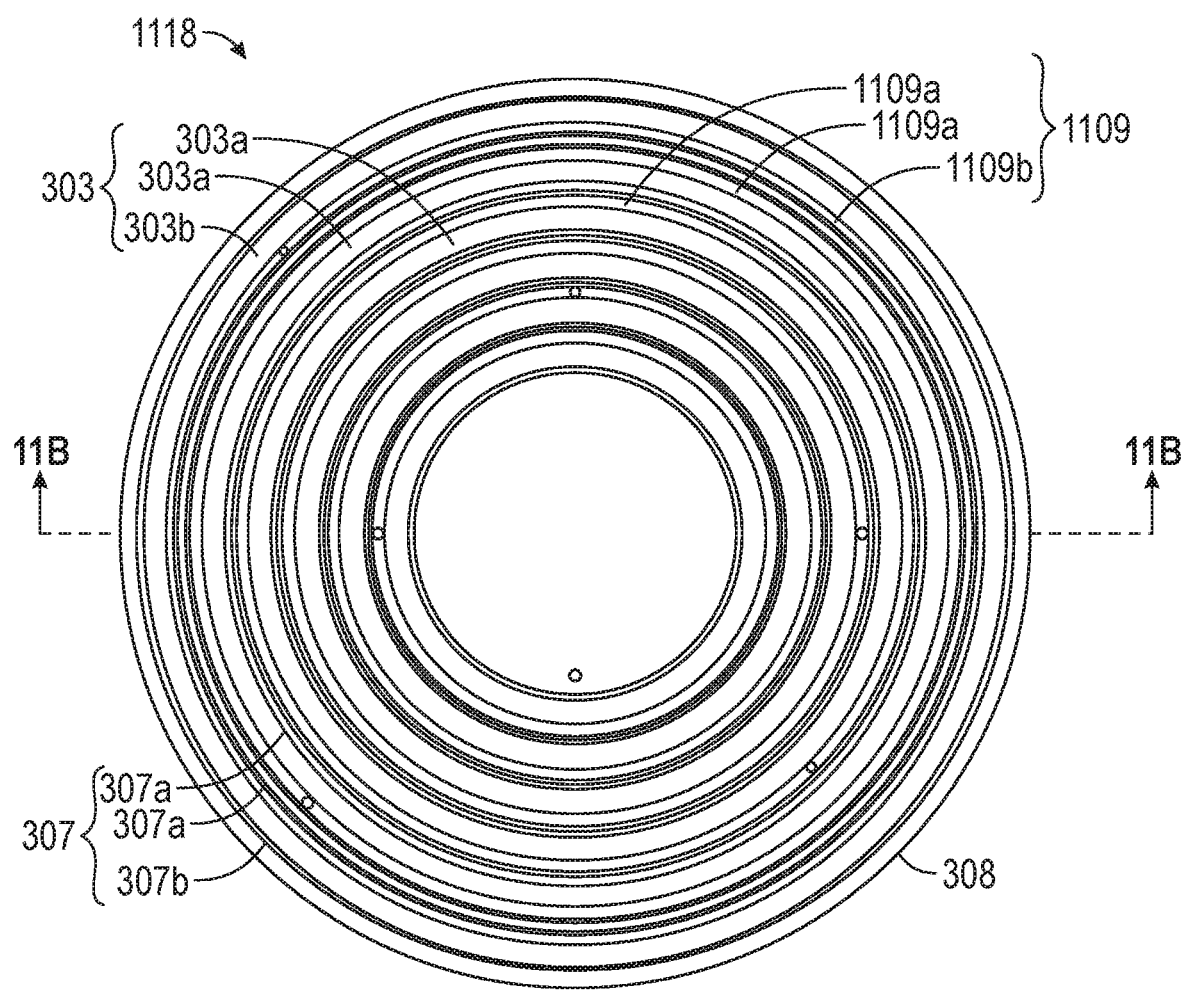
FIGS. 11a and 11b illustrate a multi-zone superstrate chuck in another embodiment with improved zone sealing.
Figure 11B:
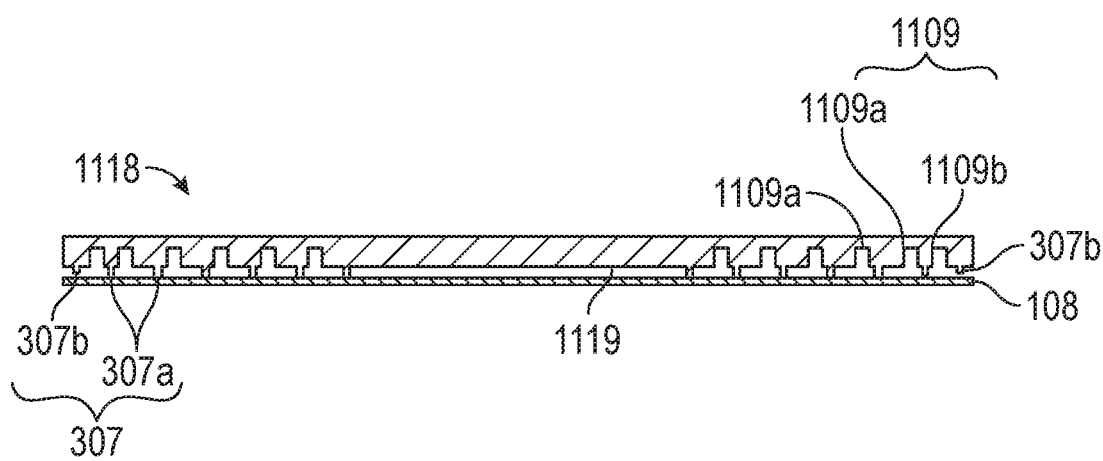
Figure 12:
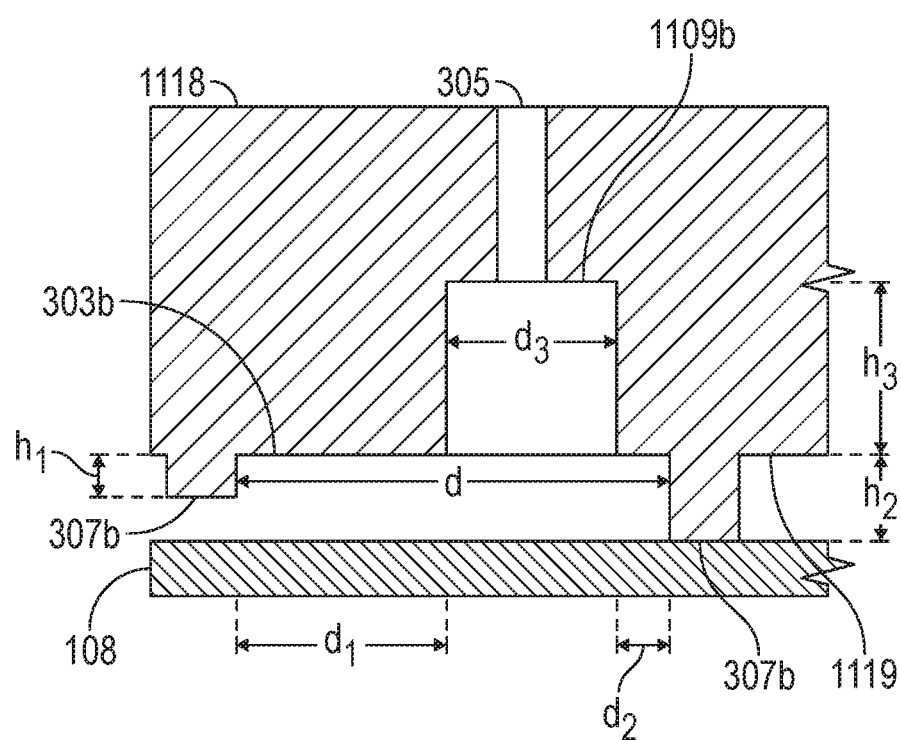
FIG. 12 shows an enlarged view of an exemplary trench structure within a zone of the FIGS. 11a and 11b superstrate chuck.

To counter such undesirable leakage, superstrate chuck 1118 is provided that incorporates trench structures 1109, as shown in FIGS. 11a and 11b. Similar to superstrate chuck 118, the superstrate chuck 1118 likewise includes a plurality of lands 307, which can be defined into a series of inner lands 307a and a peripheral land 307b protruding from a surface 1119 of the superstrate chuck 1118. As shown in FIGS. 11b and 12, the surface 1119 is the holding or retaining surface for holding or retaining the superstrate 108. A series of inner zones 303a are defined by the lands 307a. In at least one of the ring zones 303, a trench 1109 is formed that is recessed from the surface of the chuck 1118. The trench can be concentric and positioned between the corresponding lands of the ring zone. Trenches 1109a formed in the inner ring zones 303a are positioned at locations distal to the center of the chuck 1118 with respect to the associated inner ring zone width. In contrast, the trench 1109b formed in the peripheral ring zone 303b is positioned at an area proximal to the center of the substrate chuck 1118 relative to the outer zone ring width. That is, the trenches 1109a formed in the inner ring zones 303a are formed at an outer diameter of the corresponding inner ring zones 303a, while the trench 1109b formed in the peripheral ring zone 303b is formed at an inner diameter of the peripheral zone 303b.

In operation, trenches 1109 act as a buffer that provides a uniform source of high vacuum pressure that continues to act on the superstrate even in the presence of a gap between superstrate at the land distal to the trench. In this fashion, the sequential outwardly radial release of vacuum and application of positive pressure to the center zone and adjacent ring zones can proceed in a controlled manner. That is, the applied vacuum pressure in a given ring zone can be maintained, even as positive pressure is applied to the adjacent inner zone in an amount that may deflect the superstrate enough to produce a gap at the distal land. In other words, the provision of trenches 1109 allow for some leakage to be tolerated, without disruption to the intended process. Similarly, the trench 1109b located in the peripheral ring zone with smaller outer land height operates to maintain adequate vacuum pressure in the outer ring zone even in the presence of a small gap at the outer land. This enables the outer periphery of the superstrate to be held at the desired curvature both for final spreading and merging of deposited formable material droplets (see FIG. 4d) and for separation crack initiation and propagation (see e.g. FIG. 6), even in the presence of some leakage.

FIG. 12 is an enlarged cross-sectional view of exemplary trench structure 1109b. The particular trench dimensions and relevant location within the ring zone needed to achieve the desired vacuum buffering performance is dependent upon the superstrate chuck land heights and ring zone width. In the example shown in FIG. 12, the trench 1109b is located within ring zone 303b and recessed from the chuck surface. In this example, the outer land 307b has a height $h_1$ less than a height $h_2$ of the inner land 307a. In typical usage, the differences in land heights may range from about 5 microns to about 50 microns. Ring zone 303b has a width d. Trench 1109b is positioned with a first edge at a distance $d_1$ from land 307b and a second edge at a distance $d_2$ from land 307a. Trench 1109b has a depth $h_3$ and a width $d_3$. In this embodiment, the relationship between these parameters satisfies the following conditions:

$$h_1 < h_2$$

$$h_3 > 10 h_2$$

$$d_3 < 0.5 d$$

$$d_1 > d_2 + d_3.$$

The port 305 connecting the trench 1109b to the pressure supply (not shown) intersects with or is otherwise located within the trench. If the port does not intersect with the trench, the requisite high pressure cannot be maintained, and the trench will be ineffective. In the above embodiment, the outer land $h_1$ is where the leakage is expected to occur. For inner ring trenches 1109b, the land heights may be the same, i.e., $h_1 = h_2$. In this case, the distance $d_1$ is measured from the designated land (i.e., $h_1$ or $h_2$) where the leakage is expected. For example, in the embodiment of FIGS. 11a and 11b, the inner rings zone 303a include trenches 1109a positioned closer to the outer lands (as measured radially from the chuck center) of their respective ring zones to mitigate against leakage at the inner lands during the sequential vacuum release and subsequent pressurization of the ring zones as described in the processes associated with FIGS. 4-5.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A chuck, comprising:
   a plurality of lands protruding from a surface of the chuck, the lands defining a series of zones; and
   a trench recessed from the surface of the chuck in at least one of the zones,
   wherein the series of zones includes a peripheral zone immediately adjacent to an outermost land of the plurality of lands and one or more inner zones surrounded by the peripheral zone, and the trench is formed in at least one of the inner zones at an area distal to a center of the chuck, and
   the trench is formed in the peripheral zone at an area proximal to the center of the chuck.

2. The chuck of claim 1, wherein the peripheral zone has a width smaller than a width of each of the one or more inner ring zones.

3. The chuck of claim 1, wherein the trench in the at least one of the one or more inner zones has a width less than a half width of the inner zones.

4. The chuck of claim 1, wherein the lands defining the one or more inner zones are equally distant from each other.

5. The chuck of claim 1, wherein the outermost land has a height less than a height of the lands defining the one or more inner zones.

6. The chuck of claim 1, wherein the trench of each of the zones has a depth at least ten times larger than a height of each of the lands.

7. The chuck of claim 1, further comprising a fluid port in fluid communication with the trench.

8. The chuck of claim 1, wherein the one or more inner of zones are arranged concentrically about a center zone of the chuck.

9. The chuck of claim 1, wherein the chuck is configured to retain a substrate, a superstrate, or a wafer to the surface thereof.

10. The chuck of claim 1, wherein the chuck is configured to hold a substrate, a superstrate, or a wafer by applying a negative pressure to a zone surrounded by the lands.

11. A method of using a chuck, comprising:
    providing a chuck having a series of zones defined by a plurality of lands protruding from a surface of the chuck and a trenched recessed from the surface of the chuck in at least one of the series of zones;
    retaining a superstrate on the surface of the chuck;
    advancing the superstrate to be in contact with a formable material dispensed the substrate;
    curing the formable material with a curing source; and
    separating the superstrate from the cured formable material,
    wherein the series of zones includes a peripheral zone immediately adjacent to an outermost land of the plurality of lands and one or more inner zones surrounded by the peripheral zone, and the trench is formed in each of the inner zones at an area distal to a center of the chuck.

12. The method of claim 11, wherein the trench is formed in each of the one or more inner zone with a width less than a half width of each of the inner zone.

13. The method of claim 11, wherein the trench is formed in the peripheral zone in an area proximal to the center of the chuck.

14. The method of claim 11, wherein the trench is formed in each of the zones with a depth at least ten times larger than a height of each of the lands.

15. The method of claim 11, wherein the chuck further includes a vacuum port in fluid communication with each of the trenches.

16. The method of claim 11, wherein the series of zones includes a peripheral zone immediately adjacent to an outermost land of the plurality of lands and a plurality of inner zones surrounded by the peripheral zone, wherein the lands defining the series of one or more inner zones are equally distant from each other.

17. A method of manufacturing an article, comprising:
    dispensing a formable material on a substrate;
    retaining a superstrate with a superstrate chuck, wherein:
       the superstrate chuck being defined with a series of zones by a plurality of lands protruding from a surface of thereof; and a trench recessed from the superstrate chuck is formed in at least one of the series of zones;

advancing the superstrate to be in contact with a formable material dispensed on the substrate;

curing the formable material with a curing source; and separating the superstrate from the cured formable material, wherein the series of zones includes a peripheral zone immediately adjacent to an outermost land of the plurality of lands and one or more inner zones surrounded by the peripheral zone, and the trench is formed in each of the inner zones at an area distal to a center of the chuck.

\* \* \* \* \*